(12) United States Patent
Rodov et al.

(10) Patent No.: US 7,705,368 B2
(45) Date of Patent: Apr. 27, 2010

(54) INSULATED GATE TYPE THYRISTOR

(75) Inventors: Vladimir Rodov, Miyagi (JP); Hidenori Akiyama, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 72 days.

(21) Appl. No.: 11/706,184

(22) Filed: Feb. 15, 2007

(65) Prior Publication Data

US 2007/0235752 A1    Oct. 11, 2007

(30) Foreign Application Priority Data

Mar. 24, 2006   (JP)   .............................. 2006-082091

(51) Int. Cl.
*H01L 21/332*   (2006.01)
*H01L 29/74*   (2006.01)

(52) U.S. Cl. .................. 257/153; 257/137; 257/138; 257/147; 257/175; 257/176; 257/E29.036; 257/E29.037; 257/E29.038; 257/E29.046; 257/E29.047; 257/E29.048; 257/E29.115; 257/E29.125; 257/E29.211; 257/E29.214

(58) Field of Classification Search .............. 257/137, 257/138, 147, 153, 175, 176, E29.036, E29.037, 257/E29.038, E29.046, E29.047, E29.048, 257/E29.115, E29.125, E29.211, E29.214
See application file for complete search history.

(56) References Cited

U.S. PATENT DOCUMENTS

| | | | | |
|---|---|---|---|---|
| 5,202,750 A | * | 4/1993 | Gough | 257/133 |
| 5,381,026 A | * | 1/1995 | Shinohe et al. | 257/147 |
| 5,525,821 A | * | 6/1996 | Harada et al. | 257/331 |
| 5,648,283 A | * | 7/1997 | Tsang et al. | 438/138 |
| 6,091,107 A | | 7/2000 | Amaratunga et al. | |
| 2001/0032999 A1 | * | 10/2001 | Yoshida | 257/332 |
| 2005/0167742 A1 | * | 8/2005 | Challa et al. | 257/328 |

FOREIGN PATENT DOCUMENTS

| | | |
|---|---|---|
| EP | 0 854 518 A1 | 7/1998 |
| JP | 10-209432 A | 8/1998 |
| JP | 2000-311998 A | 11/2000 |
| JP | 2001-320042 A | 11/2001 |

OTHER PUBLICATIONS

Baglia et al., "The Insulated Gate Transistor: A New Three-Terminal MOS-Controlled Bipolar Power Device," IEEE Transactions on Electron Devices, Ed. 31, No. 6, (1984), pp. 821-828.

* cited by examiner

*Primary Examiner*—Ngan Ngo
*Assistant Examiner*—Benjamin Tzu-Hung Liu
(74) *Attorney, Agent, or Firm*—Birch, Stewart, Kolasch & Birch, LLP (57) ABSTRACT

An insulated gate type thyristor includes: a first current terminal semiconductor region of a first conductivity type having a high impurity concentration; a first base semiconductor region of a second conductivity type opposite to the first conductivity type having a low impurity concentration and formed on the first current terminal semiconductor region; a second base semiconductor region of the first conductivity type having a low impurity concentration and formed on the first base semiconductor region; a second current terminal semiconductor region of the second conductivity type having a high impurity concentration and formed on the second base semiconductor region; a trench passing through the second current terminal semiconductor region and entering the second base semiconductor region leaving some depth thereof, along a direction from a surface of the second current terminal semiconductor region toward the first base semiconductor region; and an insulated gate electrode structure formed in the trench.

11 Claims, 13 Drawing Sheets

INSULATED GATE TYPE THYRISTOR

CROSS REFERENCE TO RELATED APPLICATION

This application is based on and claims priority of Japanese Patent Application No. 2006-082091 filed on Mar. 24, 2006, the entire contents of which are incorporated herein by reference.

BACKGROUND OF THE INVENTION

A) Field of the Invention

The present invention relates to a thyristor and more particularly to an insulated gate type thyristor having an insulated gate.

B) Description of the Related Art

A thyristor having a pnpn lamination structure is known as a switching device having a low on-resistance. The pnpn lamination structure is understood as a structure merging a pnp bipolar junction transistor and an npn bipolar junction transistor. As a high voltage is applied between anode-cathode and a forward bias is applied to a p-type base or an n-type base, one bipolar junction transistor turns on to forward-bias the other base. The other bipolar junction transistor also turns on thereafter. Positive feedback is mutually applied to both bipolar transistors to enter a latch-up state. In this way, a low on-resistance can be realized. As the polarity of the voltage between anode-cathode is reversed, the thyristor turns off.

A gate turn-off thyristor (GTO) is a thyristor which can turn off, without reversing the polarity of voltage between anode-cathode, for example, by backward-biasing gate-cathode to pull the drain carriers in the base region through the gate electrode. Since large current flows, a proper gate drive circuit is required to be prepared.

A thyristor called an insulated gate transistor is also known (B. J. Baliga: IEEE Trans. El. Dev. ED-31, No. 6, 821, 1984). The npn portion of a pnpn thyristor structure is formed in a planar transistor structure, and an insulated gate electrode is formed on a region traversing an n-type emitter region and a p-type base region and reaching an n-type base region. A positive polarity bias voltage is applied to the insulated gate electrode to form an inversion layer in a surface layer of the p-type base region, to connect the n-type emitter region and n-type base region, to inject carriers (electrons) into the n-type base region, and to turn on the thyristor. Gate turn-off is also possible.

Instead of the planar structure, another structure has also been proposed in which an insulated gate electrode is formed in a trench formed by passing through the p-type base region from the surface of the n-type region of a pnpn lamination structure and entering the n-type base region (e.g., JP-A-2000-311998).

SUMMARY OF THE INVENTION

An object of this invention is to provide an insulated gate type thyristor having a novel structure.

Another object of this invention is to provide an insulated gate type thyristor having a low on-resistance and being capable of gate turn-off.

According to one aspect of the present invention, there is provided an insulated gate type thyristor comprising: a first current terminal semiconductor region of a first conductivity type having a high impurity concentration; a first base semiconductor region of a second conductivity type opposite to the first conductivity type having a low impurity concentration and formed on the first current terminal semiconductor region; a second base semiconductor region of the first conductivity type having a low impurity concentration and formed on the first base semiconductor region; a second current terminal semiconductor region of the second conductivity type having a high impurity concentration and formed on the second base semiconductor region; a trench structure passing through the second current terminal semiconductor region and entering the second base semiconductor region leaving some depth thereof, along a direction from a surface of the second current terminal semiconductor region toward the first base semiconductor region; and an insulated gate electrode structure formed in the trench structure.

The on-resistance is low, and gate turn-off can be made easily merely by applying a low voltage to the gate.

DESCRIPTION OF THE PREFERRED EMBODIMENTS

Figure 1:
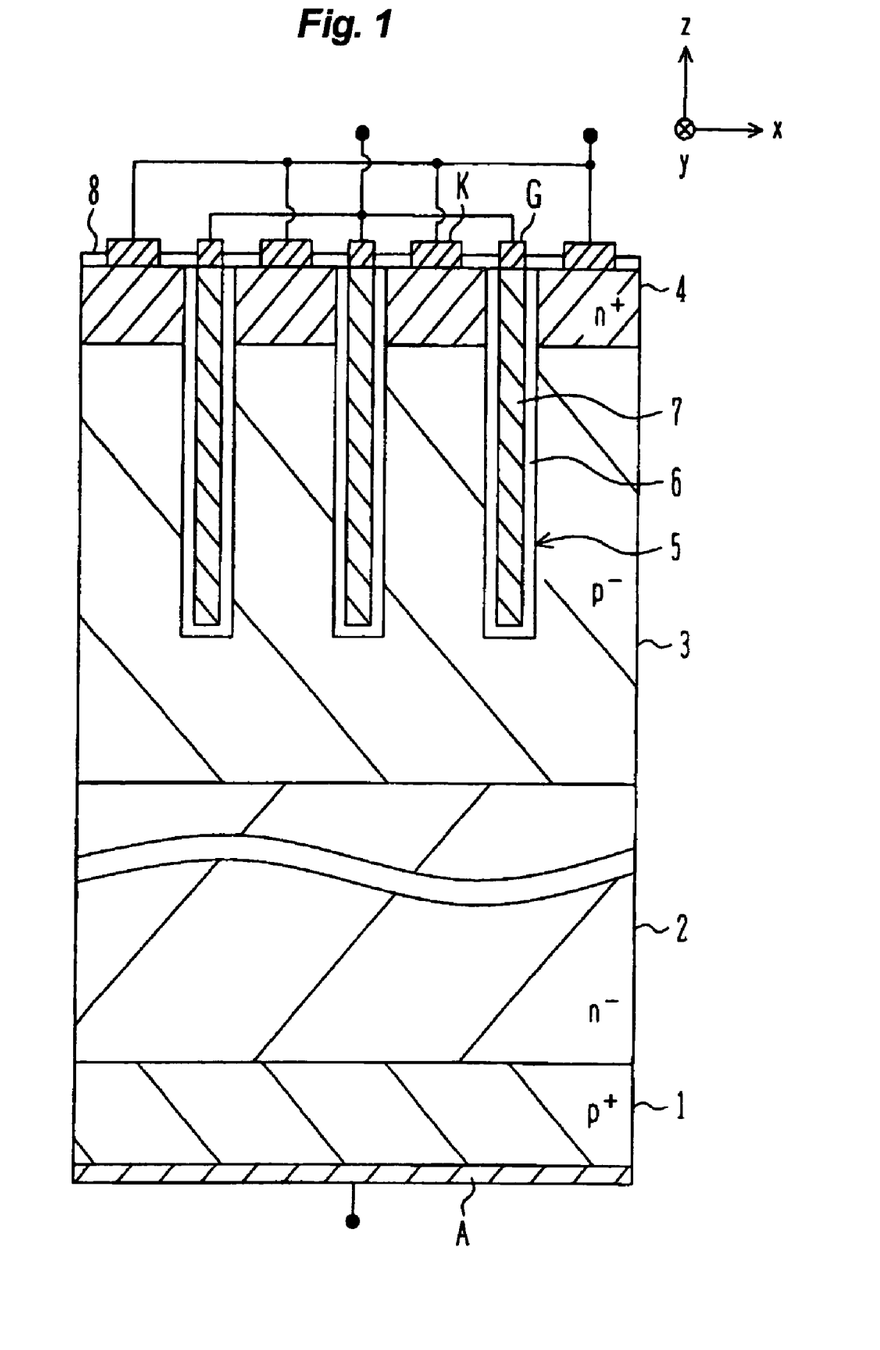
FIG. 1 is a cross sectional view of an insulated gate type thyristor according to an embodiment of the present invention.

FIG. 1 schematically shows an insulated gate type thyristor according to the embodiment of the present invention. A $p^+$-type emitter constituting one current terminal region is formed of a p-type low resistance silicon substrate 1, and an n-type epitaxial layer 2 of a low impurity concentration constituting an n-type base layer is formed on the silicon substrate. A p-type well 3 of about 5 μm in depth constituting a p-type base layer is formed in the surface layer of the n-type epitaxial layer 2. An $n^+$-type emitter layer 4 of about 1.1 μm in depth constituting the other current terminal region is formed in the surface layer of the p-type base layer. It is preferable that the $p^+$-type emitter and $n^+$-type emitter have a higher impurity concentration to make them have a lower resistance. An impurity concentration of the n-type base and p-type base is set to a value equal to or lower than a predetermined value. Most of a depletion region broadening by backward bias extends in the n-type base layer.

Trenches 5 having a width of about 0.5 μm are etched to a depth of about 3 μm from the surface of the $n^+$-type emitter layer 4, which trenches go through the $n^+$-type emitter layer 4 and enter the p-type base layer 3 to some depth thereof. The trenches 5 are formed to constitute a trench structure surrounding stripe silicon regions having a width of about 1 μm. A width of the stripe, an impurity concentration of the p-type base layer, a depth of the trench in the p-type base layer and the like are selected in such a manner that a potential of the stripe p-type base layer surrounded by the insulated gate electrodes can be controlled sufficiently by a bias voltage applied to the insulated gate structures formed in the trenches.

An impurity concentration of the p-type base layer and a thickness of a gate oxide film formed in each trench is determined from an intensity of an electric field induced in the p-type base layer by applying a voltage to the gates formed in the trenches.

A width of the stripe is determined from a range of an electric field induced upon application of voltage to the gate. A width of the stripe is set to a width capable of reliably performing an off-operation. If a depth of the trench in the p-type base layer is too shallow, it becomes difficult to sufficiently change an on-current flowing in the p-type base layer and hence to perform an off-operation, because of the not enough electric field generated from the gate.

For example, in the example described above, the trench 5 is dug to a depth of 3 μm (to a depth of 1.9 μm in the p-type base layer 3) in the p-type well having a thickness of about 5 μm (a sum of a thickness of 1.1 μm of the n⁺-type emitter layer 4 and a thickness of 3.9 μm of the p-type base layer 3), to leave the remaining thickness of about 2 μm. The trench 5 is formed to about a half the thickness of the p-type base layer 3, leaving the remaining thickness by about a half. In order to make the state that a channel is induced around the trench be considerably different from a non-induction state, it is preferable that the trench is dug to one thirds or deeper the thickness of the p-type base layer. From the view point of breakdown voltage retention, it is expected to be preferable that a distance from the bottom of the trench to the n-type base layer, i.e., a thickness of the p-type base layer excluding the trench portion, is one thirds or thicker the total thickness of the p-type base layer. In this case, a depth of the trench in the p-type base layer is in the range of one third to two thirds the thickness of the p-type base layer.

On the inner surface of the trench 5, a silicon oxide film having a thickness of, e.g., 10 nm, is formed to form a gate insulating film 6. A polycide electrode 7 as a conductive layer having a lamination of, e.g., a polysilicon layer and a W silicide layer, is buried in the remaining space in the trench. An insulating layer 8 such as silicon oxide is deposited on the n⁺-type emitter layer 4, covering the polycide gate electrodes 7, and contact holes are formed through the insulating layer to expose the polycide gate electrodes 7 and n⁺-type emitter layer 4. An anode electrode A is formed on the bottom surface of the p⁺-type substrate 1, a cathode electrode K is formed on the n⁺-type layer 4, and a gate lead electrode G is formed on the polycide gate electrodes 7. In this manner, the insulated gate type thyristor is formed.

Description will now be made on the operation of the insulated gate type thyristor shown in FIG. 1.

Figure 2A:
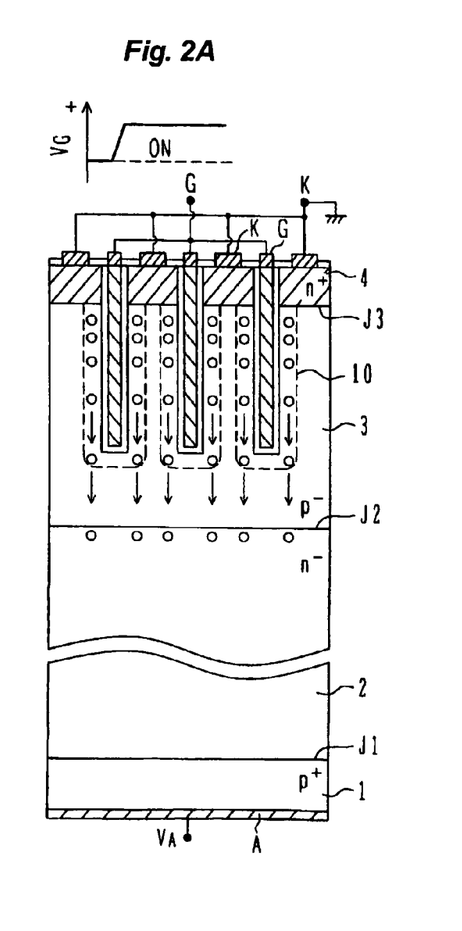
FIGS. 2A and 2B are schematic cross sectional views illustrating an on-operation of the thyristor shown in FIG. 1.

As shown in FIG. 2A, in the off-state that the cathode is grounded and a positive polarity voltage $V_A$ is applied to the anode A, a positive polarity voltage $V_G$ (e.g., 2V) equal to or higher than a threshold value is applied to the gate G. Since the positive polarity voltage is applied to the anode A, a p⁺-n⁻ junction J1 and p-n⁺ junction J3 are forward biased and a p-n⁻junction J2 is backward biased so that the junction J2 is burdened with most of the anode-cathode voltage. Since the positive polarity voltage $V_G$ equal to or higher than the threshold value is applied to the gate G, a surface layer of the p-type base layer 3 facing the gate electrode G via the gate insulating film is depleted/inverted to form an n-type channel region 10.

Since electrons are supplied from the n⁺-type layer 4 to the n-type channel region 10, an effective thickness of the p-type base layer 3 is a thickness from the lower surface of the inversion layer 10 to the p-n⁻ junction J2. An electron potential barrier formed by the p-type base layer 3 is lowered by the positive polarity bias. As the potential barrier becomes sufficiently low, electrons are injected from the n-type channel region 10 into the n-type base region 2.

Figure 2B:
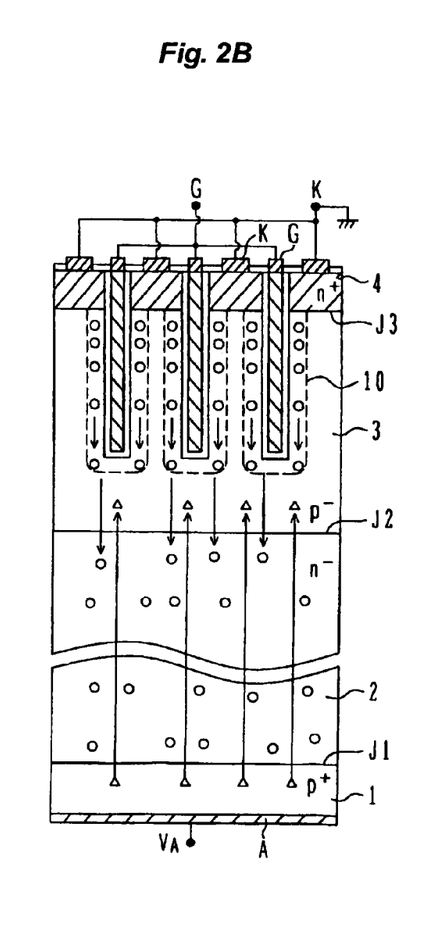

As shown in FIG. 2B, since the n⁻-type base region 2 is in a floating state, injected electrons bring the n⁻-type base region 2 to forward bias. The forward biased n⁻-type base region 2 lowers a hole potential barrier of the p⁺-type substrate 1. As the potential barrier becomes sufficiently low, holes pass over the n⁻-type base layer and are injected into the p-type base layer and bring the p-type base layer 3 to forward bias. In this manner, positive feedback is effected to turn on the thyristor.

Figure 3A:
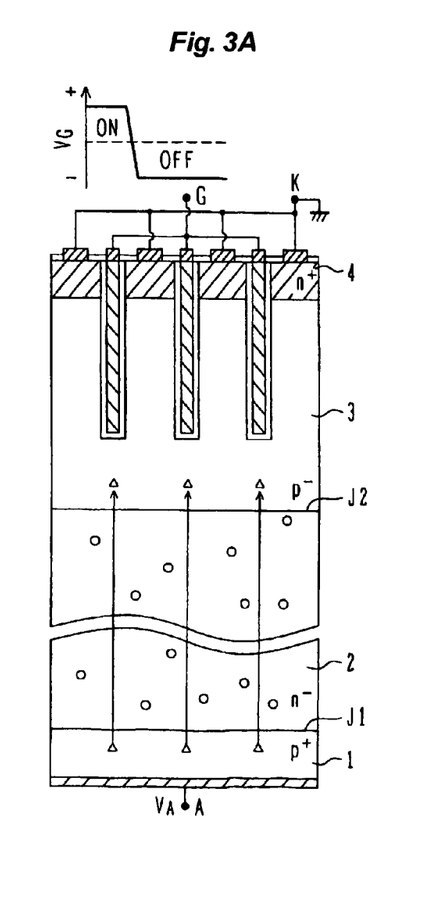
FIGS. 3A and 3B are schematic cross sectional views illustrating an off-operation of the thyristor shown in FIG. 1.

As shown in FIG. 3A, a bias voltage of the gate electrode G is changed from the on-voltage (e.g., 2 V) to a negative polarity off-voltage (e.g., −2 V). The depleted/inverted layer 10 formed in the region facing the insulated gate electrode is extinguished and the potential barrier of the p-type base layer 3 relative to electrons in the n⁺-type layer 4 is increased. It is therefore possible to stop injection of electrons from the n⁺-type layer 4 into the n⁻ base layer 2 over the p-type base layer 3. As a supply of electrons is stopped, the forward bias of the n⁻-type layer 2 lowers so that injection of holes from the p⁺-type substrate 1 into the p-type base layer 3 over the n⁻-type base layer 2 is reduced.

Figure 3B:
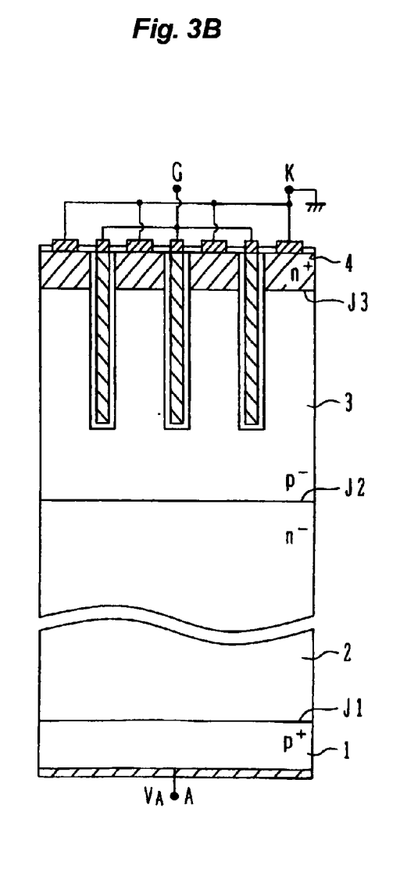

As shown in FIG. 3B, the forward bias of the p-type base layer 3 and n⁻-type base layer 2 is extinguished so that the thyristor is turned off.

If the stripe width is too wide, if the impurity concentration of the p-type base layer 3 is too high or if the depth of the trench 5 in the p-type base layer is 3 is insufficient, control by the gate electrode becomes insufficient and turn-off may become difficult.

Description will now be made on one approach to selecting a stripe width. As shown in FIG. 1, a normal direction of the trench gate is represented by an x-axis, a normal direction of the semiconductor substrate is represented by a z-axis, and a direction perpendicular to the drawing sheet is represented by a y-axis. A Debye length $L_D$ is defined as in the following and depends on an impurity concentration $N_B$ (x, y, z).

$$L_D(x, y, z) = [\in_s kT/\{q^2 N_B(x, y, z)\}]^{1/2} \quad (1)$$

where $\in_s$: a dielectric constant of Si k: the Boltzmann's constant

T: an absolute temperature q: a charge elementary quantity $N_B$ (x, y, z): an impurity concentration of the p-type base region at a position (x, y, z).

An impurity concentration changes with a position.

An electric field at a distance x from the trench gate (gate insulating film) is given by:

$$E = E0 * \exp(-x/L_D) \quad (2)$$

$$E0 = Vg/t \quad (3)$$

where Vg is a voltage applied to the gate for generating an initial electric field, and t is a thickness of the gate insulating film.

The following equation is derived from the equation (2), where E1 is an electric field at a distance x1 from the gate insulating film.

$$\ln(E0/E1) = x1/L_D \quad (4)$$

For example, assuming that Vg=2 V, t=10 nm=1E−6 cm, then E0=2 E6V/cm from the equation (3). If E1=1 V/cm, then x1=14.5*$L_D$ from the equation (4). If the position of x1 is x1=L/4 to leave L/2 at the center of the channel width L (stripe width L), then 14.5 $L_D$=L/4 and L=58 $L_D$. If 50 $L_D \geqq L$, current in the on-state is expected to be turned off.

Description will now be made on a manufacture method for the thyristor shown in FIG. 1.

Figure 4A:
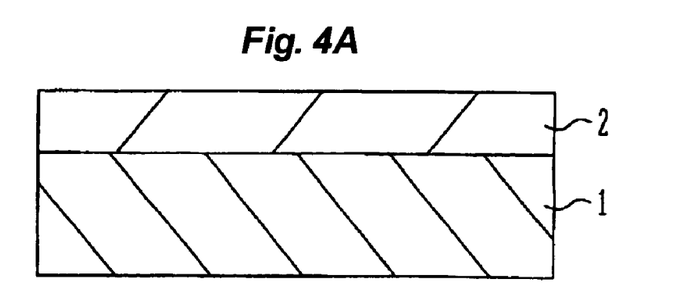
FIGS. 4A to 4R are cross sectional views and plan views illustrating main processes of a manufacture method for the insulated gate type thyristor shown in FIG. 1.

As shown in FIG. 4A, an epitaxial substrate is prepared by growing an n⁻-type epitaxial silicon layer 2 on a p⁺-type low resistance silicon substrate 1. The silicon substrate is doped with boron (B) at, for example, 2×10¹⁹ (hereinafter denoted by 2E19) cm⁻³ and has a specific resistance of 0.003 Ωcm. The epitaxial silicon layer is doped with phosphorus (P) at, for example, 5E14 cm⁻³ and has a thickness of about 80 μm. The p⁺-type substrate 1 constitutes a p-type emitter region and the n⁻-type epitaxial layer 2 constitutes an n-type base region. An impurity concentration and thickness of the epitaxial layer changes with target device specifications such as breakdown voltage. In order to raise a breakdown voltage at turn-off, it is preferable to lower an impurity concentration of the epitaxial layer (n-type base layer) constituting the n-type base region and thicken the epitaxial layer.

A thick silicon oxide film is formed on the surface of the epitaxial layer 2, and a photoresist film is coated thereon and exposed for forming an opening of a peripheral area surrounding an active region. The photoresist pattern is transferred to the silicon oxide film to form a hard mask 12 made of the 5 silicon oxide film.

Figure 4B:
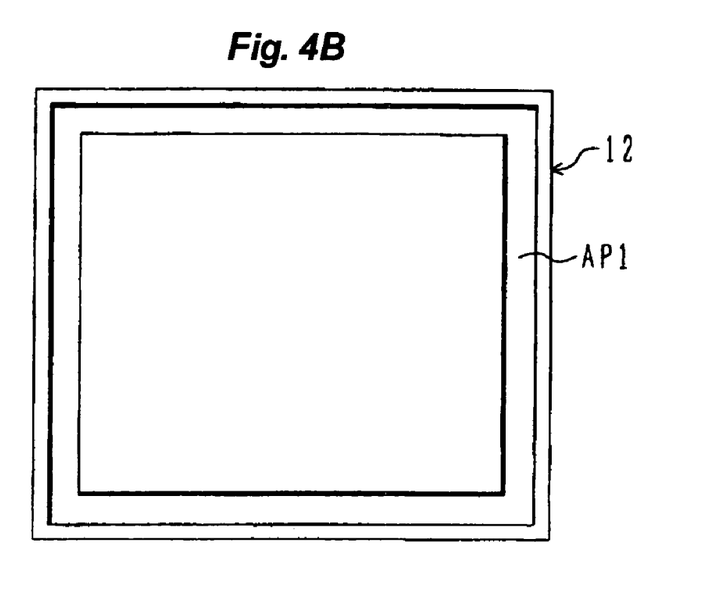

FIG. 4B is a plan view showing a pattern of the hard mask 12. An area AP1 is an opening pattern.

Figure 4C:
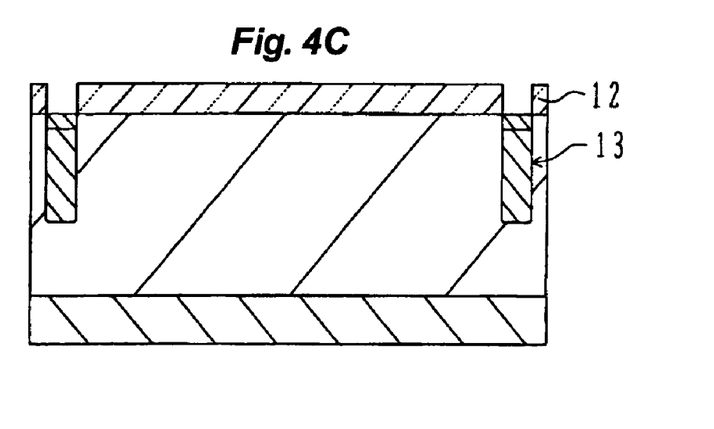

As shown in FIG. 4C, by using the hard mask pattern 12 as a mask, p-type impurity ions B are implanted, for example, at an acceleration energy of 150 keV and a dose of 4E13 cm⁻², and annealing is performed, for example, at 1050° C. in an N₂ atmosphere. Further, BF₂ ions are implanted, for example, at an acceleration energy of 100 keV and a dose of 1E13 cm⁻² to form a high impurity concentration p-type layer near the surface. These p-type regions constitute a guard ring 13 surrounding the active region. The guard ring may be formed duplicately or more.

Figure 4D:
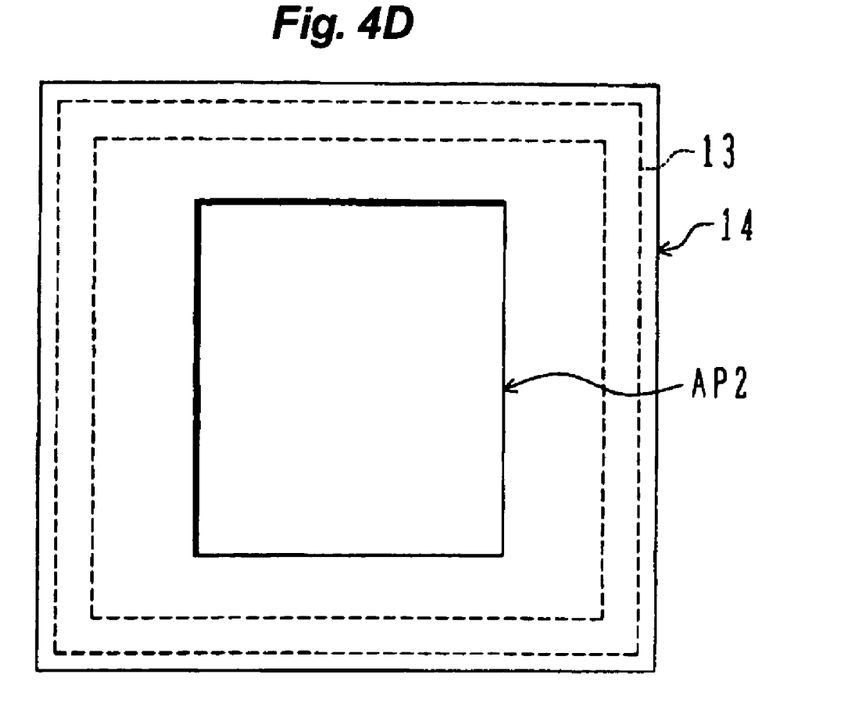

As shown in FIG. 4D, a new hard mask 14 is formed which has an opening AP2 in the active region and is made of a thick silicon oxide film or the like. The guard ring 13 formed previously is covered with the hard mask 14.

Figure 4E:
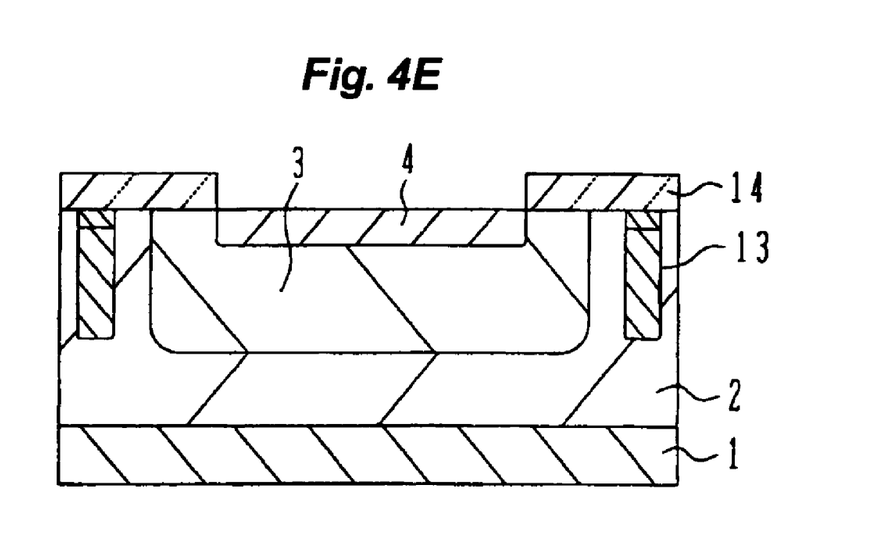

As shown in FIG. 4E, by using the hard mask 14 pattern as a mask, p-type impurity ions B are implanted, for example, at an acceleration energy of 150 keV and a dose of 1E14 cm⁻², and annealing is performed at 1175° C. in an N₂ atmosphere to form a p-type layer 3 having a depth of about 5 μm. The p-type layer 3 constitutes a p-type base region. Further, by using the same hard mask, n-type impurity ions P are implanted, for example, at an acceleration energy of 60keV and a dose of 2E6 cm⁻², and annealing is performed at 1000° C. in an N₂ atmosphere to form an n⁺-type layer 4 having a depth of about 1.1 μm. The n⁺-type layer 4 constitutes an n-type emitter region.

Figure 4F:
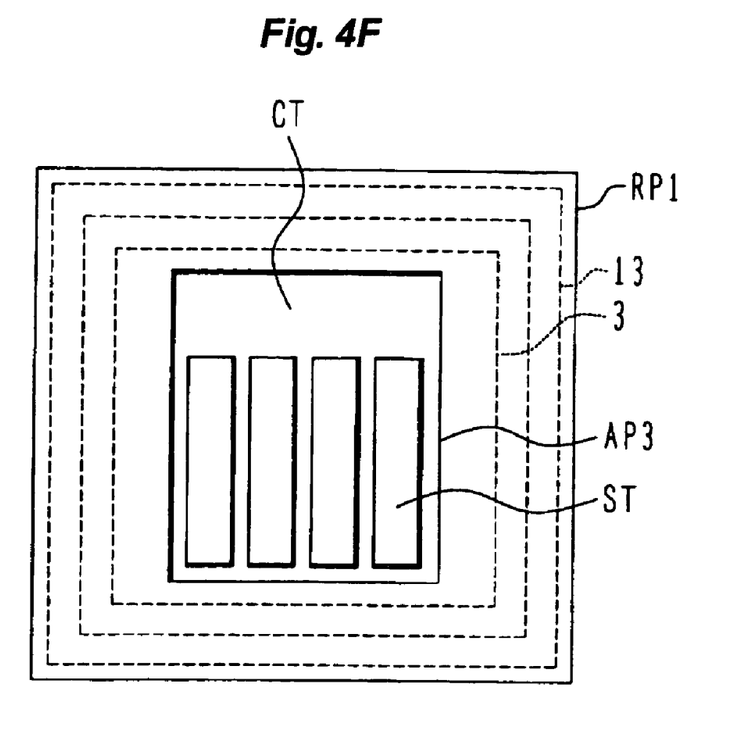

As shown in FIG. 4F, a resist pattern RP1 is formed on the substrate. The resist pattern RP1 has an opening AP3 corresponding to the n⁺-type layer 4, and stripe patterns ST having a width of about 1 μm are formed in the opening AP3. Each stripe pattern ST is surrounded by the opening AP3 including striped openings having a width of about 0.5 μm, and a broad contact opening CT is coupled in the upper portion in the figure. Although four stripe patterns are shown in the figure for simplicity, more stripe patterns are actually disposed. This arrangement is a basic unit, and a plurality of basic units may be interconnected.

Figure 4G:
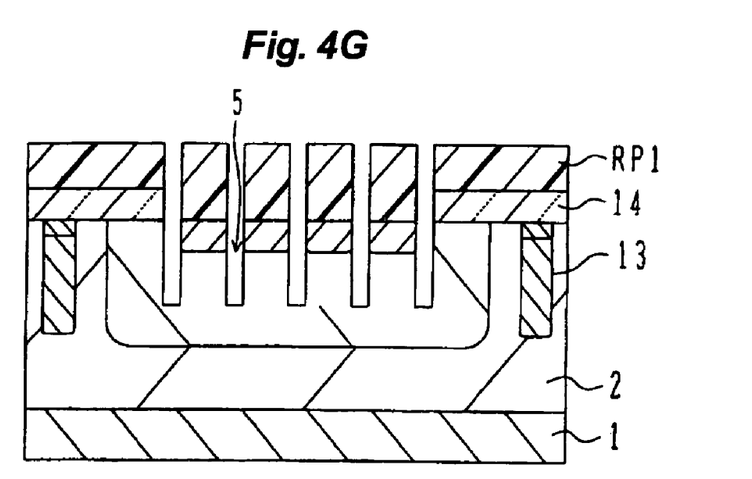

As shown in FIG. 4G, by using the resist pattern RP1 as an etching mask, silicon is etched to a depth of about 3 μm by anisotropical etching such as reactive ion etching to form trenches 5. The stripe region surrounded by the trenches 5 constitutes an active region of this invented thyristor.

Figure 4H:
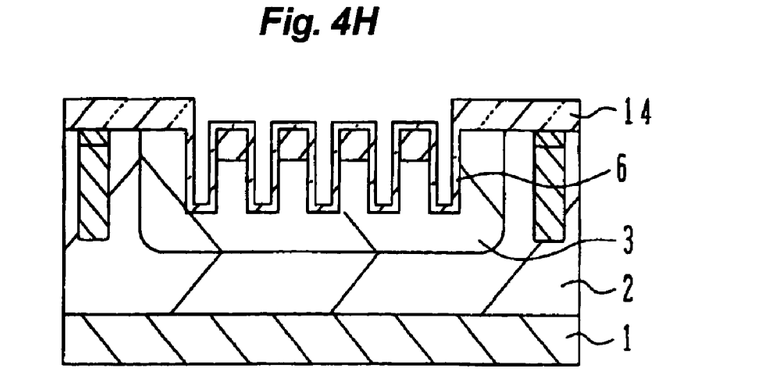

As shown in FIG. 4H, the resist pattern RP1 is removed, the inner walls of the trenches are washed, and a silicon oxide film having a thickness of, e.g., 10 nm, is formed on the silicon exposed surface by thermal oxidation to form a gate insulating film 6.

Figure 4I:
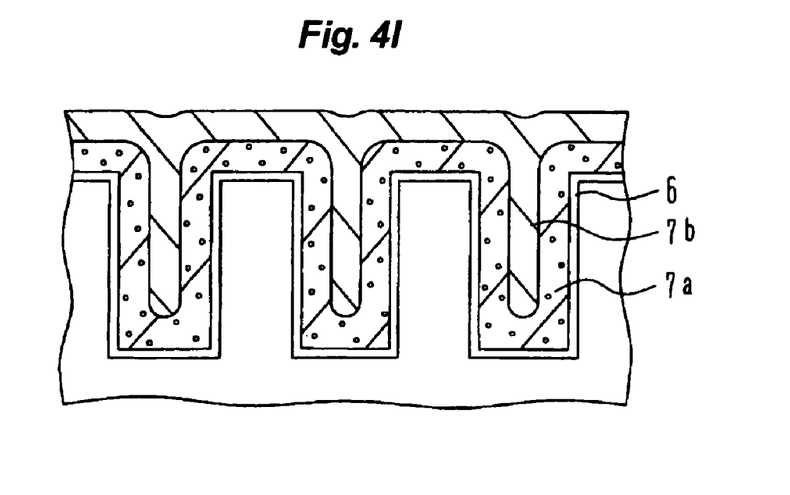

As shown in FIG. 4I, a polysilicon film doped with, e.g., P, is deposited by chemical vapor deposition (CVD) to partially bury the stripe trenches, and then a silicide layer of W silicide or the like is deposited by sputtering to completely bury at least the stripe trenches. The broad contact portion CT shown in the upper area of FIG. 4F may be or may not be completely buried. In the following description, it is assumed that silicide is deposited thick and the broad contact portion is buried completely.

Figure 4J:
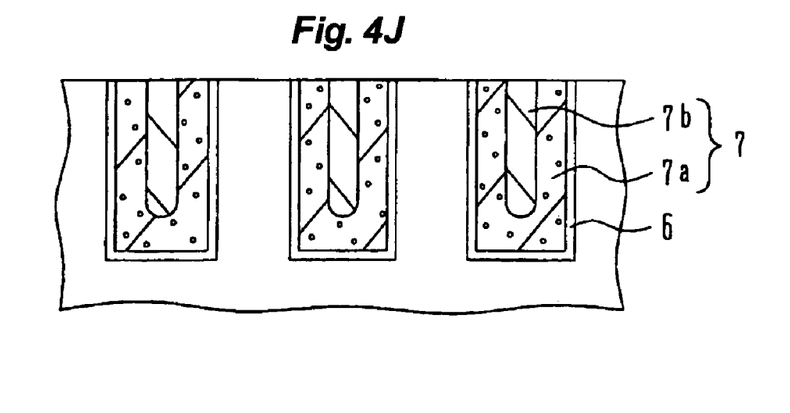

As shown in FIG. 4J, unnecessary silicide layer and polysilicon layer are removed by etch-back or chemical mechanical polishing (CMP) to leave a silicide layer 7b and a polysilicon layer 7a only in the trenches. The silicon oxide film 14 used as the mask is also removed. This polycide structure is collectively called a gate electrode 7.

Figure 4K:
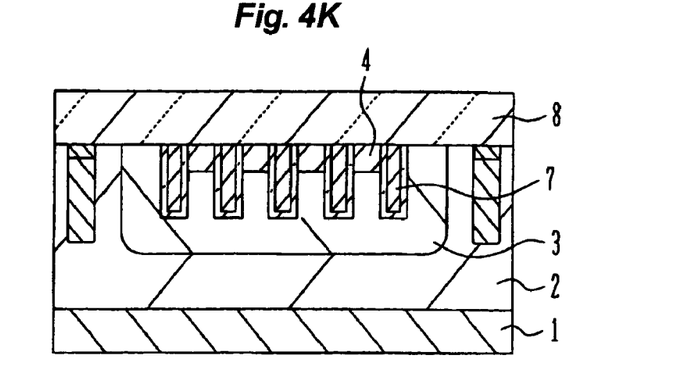

As shown in FIG. 4K, a new silicon oxide film is deposited by CVD to form an interlayer insulating film 8.

Figure 4L:
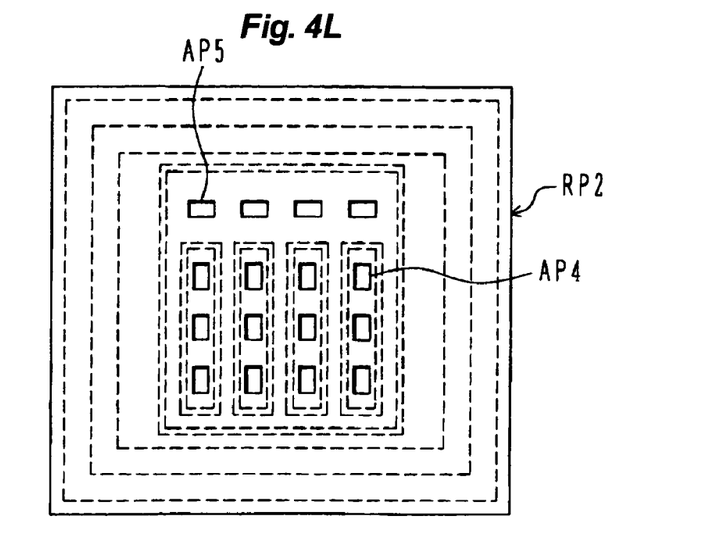

As shown in FIG. 4L, a resist pattern RP2 is formed on the interlayer insulating film 8. The resist pattern RP2 has a contact opening AP4 for the n⁺-type emitter region 4 and a contact opening AP5 for the contact portion CT.

Figure 4M:
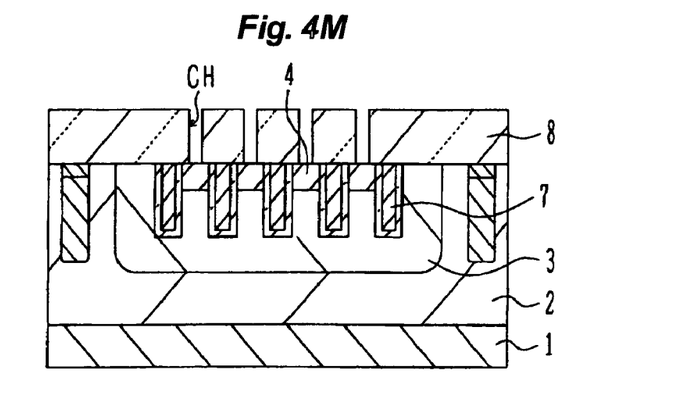

As shown in FIG. 4M, by using the resist pattern RP2 as an etching mask, the interlayer insulating film 8 is etched to form contact holes CH exposing the n⁺-type emitter region 4 and the gate electrode 7 in the contact portion. Thereafter, a barrier metal layer 18a such as a TiN layer and a main electrode layer 18b such as aluminum alloy are deposited and patterned to form lead electrodes.

Figure 4N:
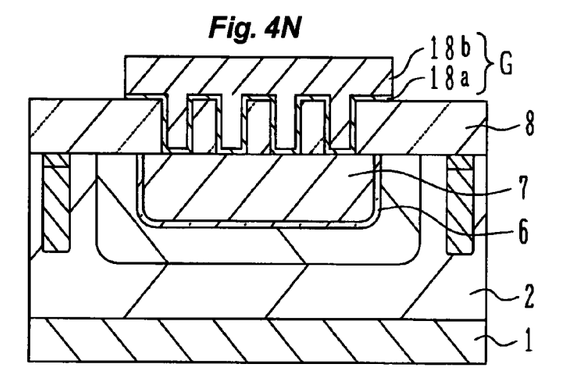
Figure 4O:
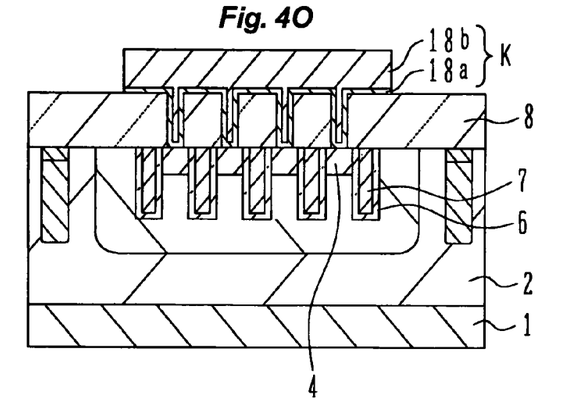
Figure 4P:
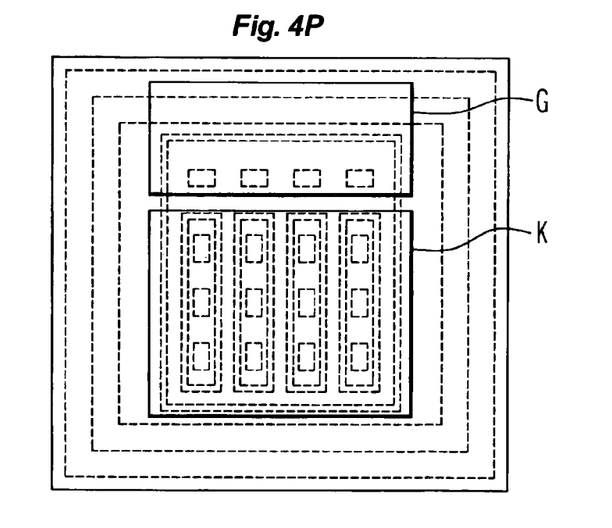

FIGS. 4N, 4O and 4P are a cross sectional view showing the gate electrode 7, a cross sectional view showing the n⁺-type emitter region 4 and a plan view showing the whole area of the invented thyristor, respectively. As shown in FIGS. 4N and 4P, a gate lead electrode G is connected via a contact hole to the gate electrode 7 in the contact portion, and as shown in FIGS. 4O and 4P, a cathode electrode K is connected via contact holes to the n⁺-type emitter region 4. An anode electrode is formed on the bottom surface of the substrate.

Figure 4Q:
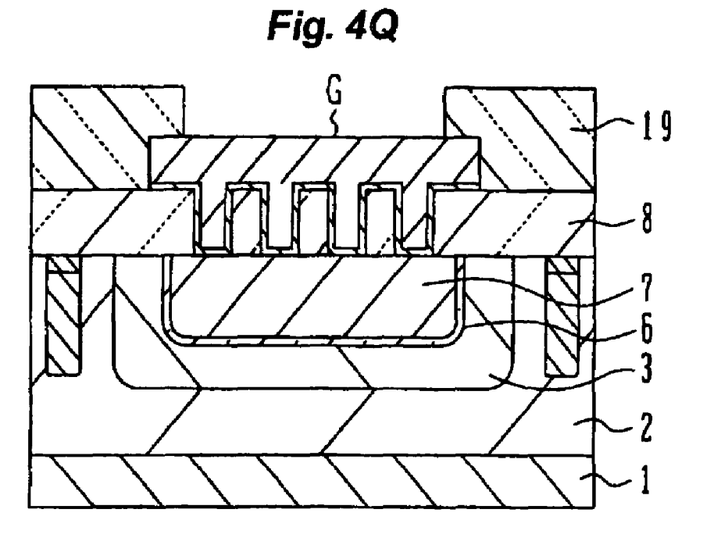
Figure 4R:
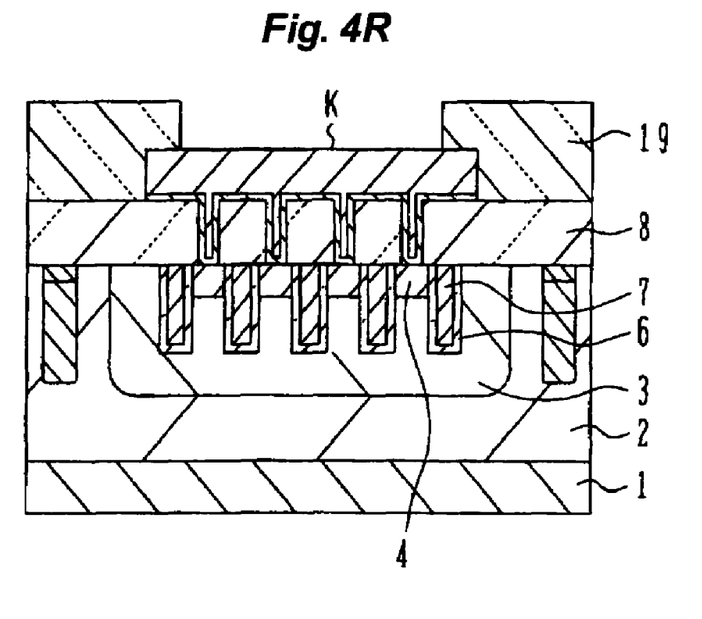

As shown in FIGS. 4Q and 4R, a passivation film 19 of silicon nitride or the like is deposited by CVD, covering the gate lead electrode G and cathode electrode K. The passivation film on contact areas is removed to expose the surface of each electrode.

In the manner described above, the insulated gate type thyristor shown in FIG. 1 is manufactured.

The performance of the thyristor manufactured under the above-described conditions was simulated with a two-dimensional process-device simulator manufactured by Silvaco International Inc. A trench width was set to 0.5 μm, a trench depth was set to 3.0 μm, and a stripe width was set to 1.0 μm.

Figure 5A:
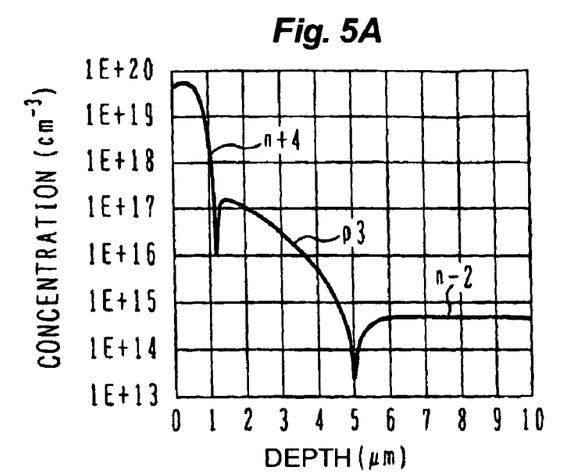
FIGS. 5A to 5D are graphs showing the characteristics of the thyristor of the embodiment obtained by simulation.

FIG. 5A shows a doping profile in a depth direction at a position apart from the trench side wall surface by 0.2 μm. The n⁺-type layer 4 is formed from the substrate surface to a depth of about 1.1 μm, and the p-type layer 3 is formed under the n⁺-type layer to a depth of about 5 μm. The n⁻-type epitaxial layer 2 having a constant impurity concentration is formed under the p-type layer.

Impurity concentration of the n⁻-type epitaxial layer 2 is 5E14 cm³. It may preferably be 1E15 cm⁻³ or lower. An impurity concentration of the p-type base layer 3 increases toward the surface, and its peak concentration exceeds 1E17 cm$^{-3}$ which is higher by two digits or more than that of the n-type epitaxial layer. The peak concentration may preferably be higher at least by one digit or more. The impurity concentration of the p-type base layer 3 distributes approximately in the range of 5E14 to 1E17 cm$^{-3}$, and about 3E16 cm$^{-3}$ at a trench bottom at 3 µm in depth which is higher by about one digit than the impurity concentration of the n-type epitaxial layer.

Figure 5B:
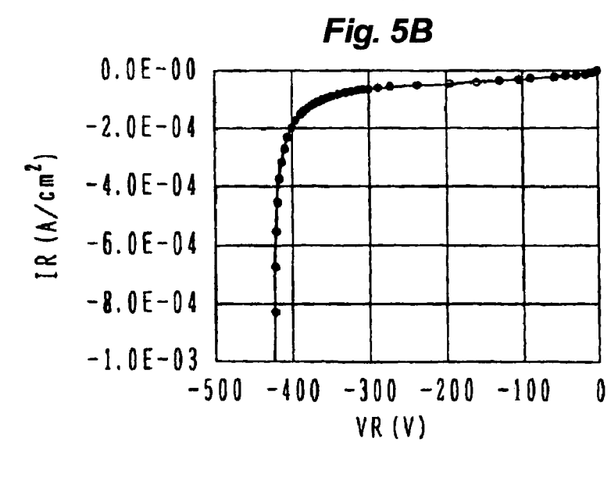

FIG. 5B shows the backward characteristics of the off-state applying −2 V to the gate. A backward voltage VR is applied to the anode while the gate and cathode are grounded. A backward current IR is very small as the backward voltage VR is in the range of 0 V to about −300 V. The thyristor is in a backward breakdown state at the backward voltage VR of about −400 V.

Figure 5C:
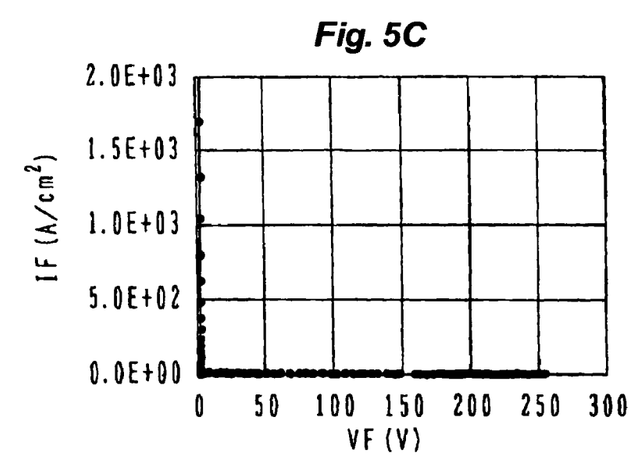
Figure 5D:
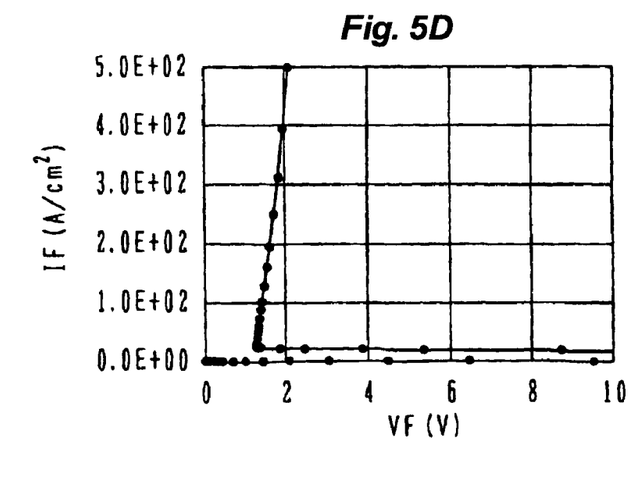

FIG. 5C shows the I-V characteristics of the on-operation. FIG. 5D is a partial enlarged diagram of FIG. 5C. While the cathode is grounded and a forward bias of 2 V is applied to the gate, a forward voltage VF gradually increasing its amplitude is applied to the anode. In excess of a forward voltage VF of about 260 V, a voltage between anode-cathode lowers abruptly to 2 V or smaller. As a forward current IF increases, the forward voltage VF increases gradually. At the forward current IF of about 350 A/cm$^2$, the forward voltage increases to about 2 V. It was confirmed that the thyristor turned off as the gate bias voltage was switched to a negative polarity voltage of −2 V.

It was found that a voltage of 300 V and a current of 2000 A/cm$^2$ or large were able to be turned on and off by gate voltages of +2 V and −2 V, respectively. This invented thyristor can therefore be realized in which large current can be turned on and off by low gate voltages.

The gate wiring and cathode wiring may be formed by different wiring layers. In this case, wirings can be crossed as in the case where a plurality of unit thyristors (basic units) are formed on a single substrate or integrated with another semiconductor device.

Figure 6:
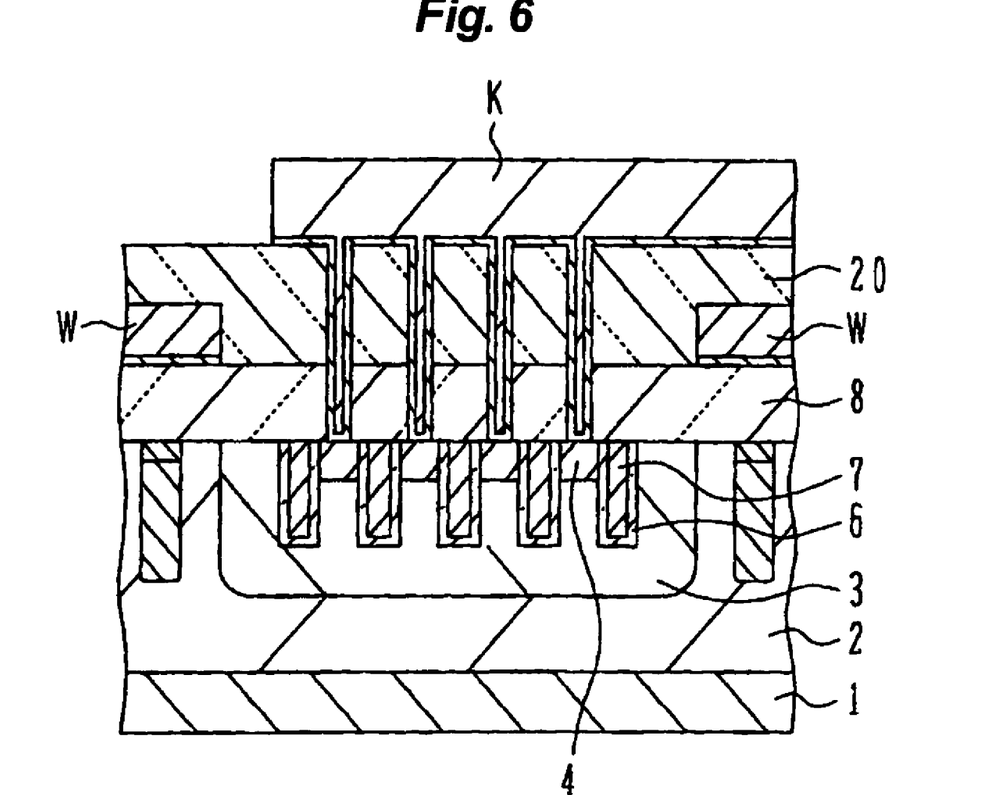
FIG. 6 is a cross sectional view of a semiconductor device according to an example of the modification.

FIG. 6 shows an example of a multi-layer wiring structure. A first insulating film 8 is formed, and gate contact holes and the like are formed through the first insulating film. Gate lead electrodes G shown in FIGS. 4N, 4Q and 4P and wirings W are formed in a first wiring layer. A second insulating film 20 is formed covering the first wiring layer. Contact holes for the n$^+$-type emitter and the like are formed through the second insulating film 20. A cathode electrode K is formed in the second wiring layer by filling conductor in the contact holes. The wiring W in the first wiring layer can be crossed over the wiring K and the like in the second wiring layer. Thereafter, a passivation film of silicon nitride or the like is deposited by CVD or the like.

Figure 7:
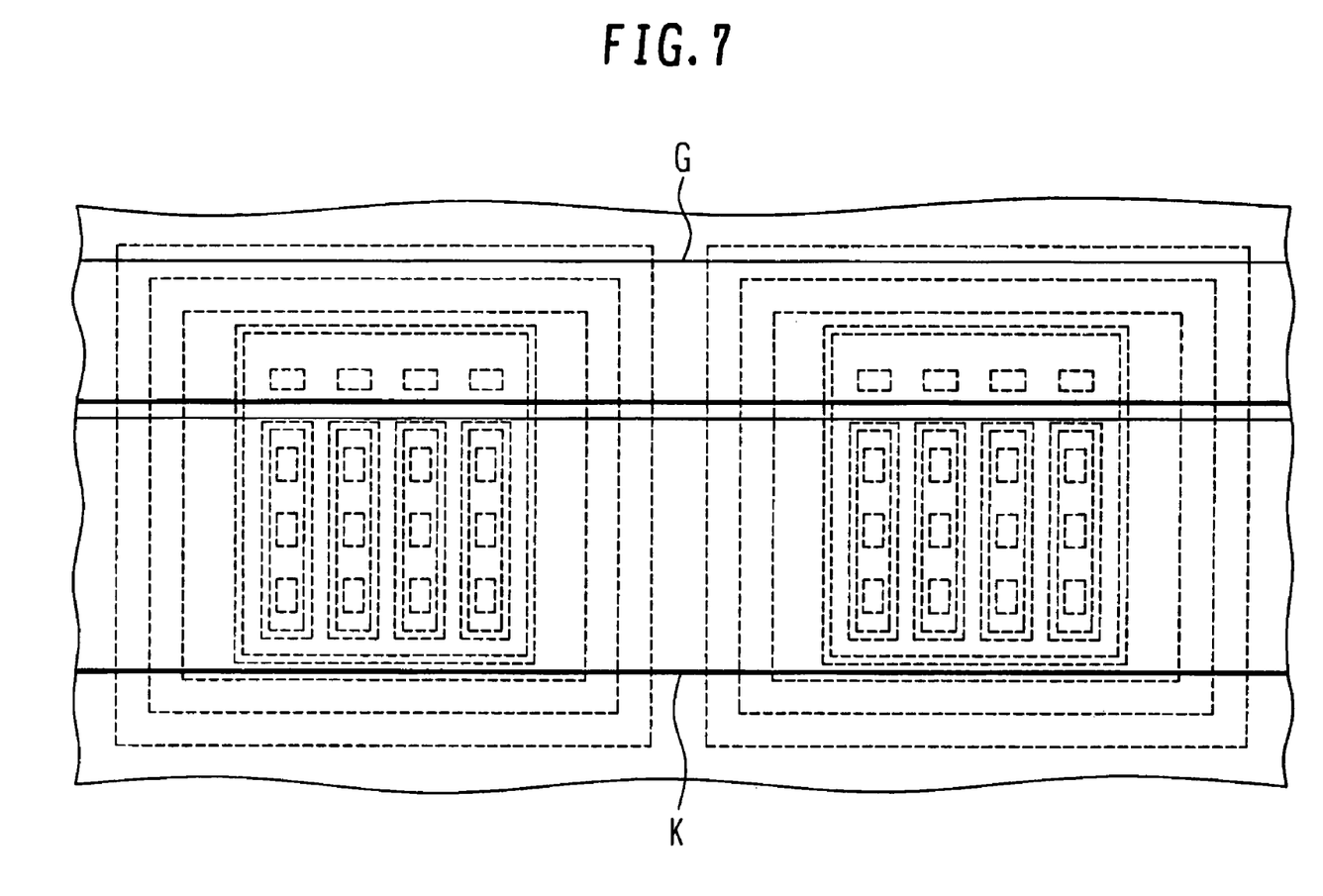
FIG. 7 is a plan view of a semiconductor device according to another example of the modification.

FIG. 7 shows an example of the structure connecting a plurality of basic units. A common gate lead electrode G is connected to a gate electrode 7 shown in FIG. 4Q of each basic unit, and a common cathode electrode K is connected to the n$^+$-type emitter region 4 shown in FIG. 4R of each basic unit.

Various modifications of the above-described embodiment are possible. For example, the n$^+$-type emitter and the p-type base region continuous with the n$^+$-type emitter are divided in stripe shapes. Instead of the strip shape, other plan shapes such as a circular shape may also be adopted.

The material, size, impurity concentration and the like of each constituent element may be changed in various ways depending on various conditions. A conductivity type may be reversed all. It will be apparent to those skilled in the art that other various modifications, improvements, combinations, and the like can be made.

What are claimed are:

1. An insulated gate type three terminal thyristor comprising:
   a first current terminal semiconductor region of a first conductivity type having a first impurity concentration;
   a first base semiconductor region of a second conductivity type opposite to the first conductivity type having a second impurity concentration and formed on said first current terminal semiconductor region;
   a second base semiconductor region of the first conductivity type having a third impurity concentration lower than the first impurity concentration and formed on said first base semiconductor region;
   a second current terminal semiconductor region of the second conductivity type having a fourth impurity concentration higher than the second impurity concentration and formed on said second base semiconductor region;
   a trench structure passing through said second current terminal semiconductor region and entering said second base semiconductor region without reaching the first base semiconductor region;
   a first electrode connected to the first current terminal semiconductor region;
   a second electrode connected to the second current terminal semiconductor region; and
   a third electrode having an insulated gate electrode structure formed in said trench structure,
   wherein said trench structure divides an upper portion of said second base semiconductor region into a plurality of regions, and is formed surrounding each divided region,
   wherein said first base, second base, first current terminal and second current terminal semiconductor regions are made of silicon,
   wherein the divided upper portions of said second base semiconductor region have stripe-shaped portions as viewed in plan, and
   wherein said trench structure surrounding said stripe-shaped portion defines a common contact recess at one end along a stripe longitudinal direction, and said insulating gate electrode structure includes a gate electrode portion surrounding said stripe-shaped portion in the upper position of said second base semiconductor region and a contact portion formed in said common contact recess.

2. The insulated gate type three terminal thyristor according to claim 1, further comprising:
   an insulating layer formed covering said insulated gate electrode structure and said second current terminal semiconductor region;
   current terminal electrodes passing through said insulating layer and contacting said stripe-shaped portions at a plurality of positions; and
   a gate lead electrode passing through said insulating layer and contacting said contact portion of said insulated gate electrode structure.

3. The insulated gate type three terminal thyristor according to claim 1, wherein the upper portion of said second base semiconductor region surrounded by said trench structure has a stripe width L and a Debye length $L_D$ where a relation of $50*L_D \geq L$ is satisfied.

4. The insulated gate type three terminal thyristor according to claim 1, wherein said insulated gate electrode structure includes a silicon oxide film formed on a surface of said trench structure, a polysilicon film deposited on the silicon oxide film and a silicide film deposited on the polysilicon film.

5. The insulated gate type three terminal thyristor according to claim 1, wherein said trench structure is formed digging one thirds or more of a thickness of said second base semiconductor region.

6. The insulated gate type three terminal thyristor according to claim 1, wherein the first conductivity type is a p-type and the second conductivity type is an n-type.

7. The insulated gate type three terminal thyristor according to claim 6, wherein said first current terminal semiconductor region is a high impurity concentration p-type silicon substrate, said first base semiconductor region is a low impurity concentration n-type silicon epitaxial layer, said second base semiconductor region is a p-type region formed in a surface layer of said epitaxial layer through ion implantation, and said second current terminal semiconductor region is a high impurity concentration n-type region formed in an upper portion of said p-type region through ion implantation.

8. The insulated gate type three terminal thyristor according to claim 1, wherein said second base semiconductor region is a well region formed in said first base semiconductor region, and the insulated gate type thyristor further comprising a guard ring of the first conductivity type formed in said first base semiconductor region and surrounding said well region.

9. The insulated gate type three terminal thyristor according to claim 1, wherein a plurality of trench structures are formed and said insulated gate electrode structure is formed in each trench structure.

10. The insulated gate type three terminal thyristor according to claim 1, wherein said first base semiconductor region and said second base semiconductor region are electrically floating.

11. The insulated gate type three terminal thyristor according to claim 1, wherein said second current terminal semiconductor region is formed directly on said second base semiconductor region.

* * * * *